United States Patent [19]

Hughes et al.

[11] Patent Number: 4,874,711
[45] Date of Patent: Oct. 17, 1989

[54] METHOD FOR ALTERING CHARACTERISTICS OF ACTIVE SEMICONDUCTOR DEVICES

[75] Inventors: David W. Hughes, Chamblee; Robert K. Feeney, Doraville; David R. Hertling, Stone Mountain, all of Ga.

[73] Assignee: Georgia Tech Research Corporation, Atlanta, Ga.

[21] Appl. No.: 145,623

[22] Filed: Jan. 19, 1988

Related U.S. Application Data

[63] Continuation-in-part of Ser. No. 53,474, May 26, 1987, abandoned.

[51] Int. Cl.$^4$ .................... H01L 21/326; H01L 21/66
[52] U.S. Cl. ........................................ 437/8; 437/170; 437/172; 437/957
[58] Field of Search ................. 437/170, 172, 957, 8

[56] References Cited

U.S. PATENT DOCUMENTS

| | | | |
|---|---|---|---|
| 3,742,592 | 7/1973 | Rizzi et al. | 437/7 |
| 3,781,977 | 1/1974 | Hulmes | 437/170 |
| 4,156,926 | 5/1979 | Hartman | 364/900 |
| 4,387,503 | 6/1983 | Aswell et al. | 437/921 |
| 4,507,757 | 3/1985 | McElroy | 365/104 |
| 4,646,427 | 3/1987 | Doyle | 437/170 |

FOREIGN PATENT DOCUMENTS

| | | |
|---|---|---|
| 57-1233 | 1/1982 | Japan . |
| 604500 | 7/1948 | United Kingdom . |
| 877422 | 9/1961 | United Kingdom . |

OTHER PUBLICATIONS

Vyne et al., IEEE Intl. Solid-State Circuits Conf. (1987), pp. 174, 175, 387, 388.

*Primary Examiner*—Olik Chaudhuri
*Attorney, Agent, or Firm*—Michael B. Einschlag

[57] ABSTRACT

Method for altering an electrical characteristic of a circuit having at least one active semiconductor device involves applying at least one pulse—a voltage pulse, a current pulse, an energy pulse, or a power pulse and so forth—across the active semiconductor device, the pulse having sufficient amplitude of one or more of its electrical parameters and time duration to alter the electrical characteristics of the device, and thereby, the electrical characteristic of the circuit. The pulse is applied across the junction by applying it to at least one terminal or electrode which is contacted to semiconductor material disposed within the device. In a preferred embodiment of the inventive method, the amplitudes of the electrical parameters and the time duration of the at least one pulse should be high enough to ensure that dendrites or filaments of material from the electrode are formed in the semiconductor material of the active semiconductor device but whose dendrites or filaments are not of a geometry to cause a short cricuit to be formed between any pair of electrodes of the active semiconductor device.

16 Claims, 5 Drawing Sheets

METHOD FOR ALTERING CHARACTERISTICS OF ACTIVE SEMICONDUCTOR DEVICES

BACKGROUND OF THE INVENTION

This is a continuation-in-part of patent application Ser. No. 053,474 filed May 26, 1987, now abandoned.

This invention relates to a method for altering the electrical characteristics of circuits and, in particular, to a method for altering the electrical characteristics of circuits which comprise at least one active semiconductor device.

The silicon integrated circuit industry has long recognized the need to develop methods to mitigate the effects of processing variations in order to obtain satisfactory yields of high performance integrated circuit chips and/or discrete components. As a consequence of processing variations, either the design requirements for the operating parameters of the resulting chips and/or discrete components are not met or, in extreme cases, the resulting chips and/or discrete components do not function at all. Thus, the yield of the chips and/or components is low and the manufacturing cost is high. In addition, yields tend to decrease markedly as a result of processing variations as an integrated circuit becomes more complex. As a consequence, a large scale integrated circuit may have a trivial yield in practice.

One commonly used method for altering circuit parameters to mitigate the effects of processing variations, such methods being generally referred to in the art as "trimming" or "tweaking," is the so-called "zener zapping" method. This, and similar methods known in the art, involve patching elements into or out of the active circuitry by creating either shorts or open circuits. In such methods, lasers and electrically fusible links are commonly used to achieve the requisite shorts or opens. Such tweaking methods for altering circuits are particularly important for use in manufacturing analog circuits because these circuits typically have stringent requirements placed on their parametric quantities.

Tweaking is also necessary with hybrid circuits. In this case, tweaking is frequently done by substitution of components, mechanical manipulation of trimming tabs or adjustment of external power supplies. Unfortunately, these methods cannot easily be applied to integrated circuits made from silicon, gallium arsenide or other semiconductors.

Regardless of the details, conventional trimming techniques have disadvantages. For example, the necessity to design-in the capability to trim the circuitry of interest produces complex trimming circuits as more demanding chips and/or highly variable manufacturing processes are developed. Hence, conventional trimming methods inflate the component count and, therefore, the chip size in an attempt to tweak out the inevitable results of process variation.

SUMMARY OF THE INVENTION

Embodiments of the present invention solve the above-identified problems with known methods for altering the electrical characteristics of a circuit without: (1) necessarily utilizing extraneous circuit elements, (2) destroying existing circuit elements, or (3) bypassing existing circuit elements. In fact, embodiments of the present invention provide a method for directly altering the electrical parameters or characteristics of a circuit which comprises at least one active semiconductor device such as, for example, a junction field-effect transistor (JFET) or a metal-oxide-semiconductor field-effect transistor (MOSFET).

A first embodiment of the invention method for altering an electrical characteristic of a circuit having at least one active semiconductor device comprises applying at least one pulse—a voltage pulse, a current pulse, an energy pulse, or a power pulse and so forth—to the device, the pulse having sufficient amplitude of one or more of its electrical parameters and time duration to alter the electrical characteristics of the device and, thereby, the electrical characteristics of the circuit. The pulse is applied to the device by applying it to at least one terminal or electrode which is contacted to the semiconductor device. In a preferred embodiment of the inventive method, the amplitude of one or more of the electrical parameters and the time duration of the at least one pulse should be high enough to ensure that dendrites or filaments of material from the electrode, for example, metal, are formed in the semiconductor material of the device. These dendrites or filaments are not, however, of a geometry to cause a short circuit to be formed between any pair of terminals of the semiconductor device.

The term "voltage pulse" is used to define an electrical pulse whose voltage characteristic is predetermined, the term "current pulse" is used to define an electrical pulse whose current characteristic is predetermined, the term "energy pulse" is used to define an electrical pulse whose energy characteristic is predetermined, the term "power pulse" is used to define an electrical pulse whose power characteristic is predetermined, and so forth. The term "amplitude of one of its electrical parameters" is used to define a voltage amplitude, a current amplitude, an energy amplitude, or a power amplitude, and so forth. Further, the term "amplitude of one or more of its electrical parameters" is used to define one or more of the following: a voltage amplitude, a current amplitude, an energy amplitude, or a power amplitude, and so forth. In addition, in order to achieve the required alteration of the electrical characteristics of the active device in accordance with the inventive method, the pulses will typically have an amplitude of one or more of its electrical parameters, whether it be voltage or current or power and so forth, which substantially exceeds the amplitude of the normal operating condition of the corresponding electrical parameters for the active device. Further in addition, the term "electrical pulse" is used to define an electrical signal which commences at a first point in time and ends at a second point in time. Typically, but not necessarily, the time duration between the first and second points in time is not long.

The circuit whose characteristics are altered in accordance with the present invention may be a discrete component, an integrated circuit containing many semiconductor devices, or a circuit comprising many integrated circuits. Thus, in manufacturing a complex circuit it may be necessary to use embodiments of the inventive method to alter several semiconductor devices contained at various locations and in various components in the circuit to achieve a desired adjustment of particular electrical characteristics of the circuit as a whole. The term "active semiconductor device" refers to a device such as a bipolar transistor, a junction field-effect transistor, a metal-oxide-semiconductor field-effect transistor and the like which has 3 or more terminals or electrodes and which can be used, for example, to amplify electrical signals.

Further embodiments of the inventive method involve measuring a predetermined electrical characteristic of the circuit, applying an alteration pulse to the semiconductor device, and then repeatedly applying the pulse or other pulses having variable amplitude of one or more of its electrical parameters and time duration and measuring the electrical characteristic until the difference between the measured value and a predetermined value of the electrical characteristic is within a predetermined amount. In such an embodiment, one may not know a priori the parameters of an appropriate pulse to use to obtain the desired alteration. For that reason, one typically might apply pulses having a decreasing ability to alter the electrical characteristic as the desired value is approached.

Embodiments of the inventive method are advantageously used to trim a metal-oxide-semiconductor field-effect transistor (MOSFET) and a junction field-effect transistor (JFET). For example, embodiments of the inventive method for use in trimming a MOSFET include, but are not limited to: (1) tying the gate to the source and applying appropriate pulses between the drain and source; (2) tying the gate to the drain and applying appropriate pulses between the drain and source; (3) floating the gate and applying appropriate pulses between the drain and source; (4) returning the gate to the drain and source through a first and a second resistor, respectively, and applying the appropriate pulses between the drain and source; (5) tying a large capacitance between the gate and source and applying appropriate pulses between the drain and source; and (6) tying a first large capacitance and a second large capacitance between the gate and drain and the gate and source, respectively, and applying appropriate pulses between the drain and source. Further embodiments of the inventive method are advantageously used to trim between similar pins on devices. Specifically, such embodiments trim between multi-base, multi-collector or multi-emitter pins of a bipolar transistor. In addition, such embodiments also trim between similar pins on field-effect transistors and so forth.

It is believed that embodiments of the inventive method alter an electrical characteristic of a circuit by modifying the electrical characteristics of a semiconductor device contained within the circuit. In the preferred embodiment discussed above, the electrical characteristics of the semiconductor are modified by introducing dendrites or filaments of material, for example, metal from at least one terminal or electrode into semiconductor material disposed in the semiconductor device. It is for this reason that the preferred embodiment of the inventive method requires the pulses, whether they be current pulses or voltage pulses and the like, to have sufficient amplitudes of their electrical parameters and time duration to cause dendrites or filaments to be formed in semiconductor material of the semiconductor device. These dendrites or filaments are not of a geometry to cause a short circuit to be formed between any pair of terminals of the semiconductor device.

As discussed above, embodiments of the inventive method may be used to trim or alter an electrical characteristic of (1) a discrete component such as a field-effect transistor, or (2) a semiconductor component which is associated with other components in a composite circuit. In the latter case, the electrical characteristics of at least one semiconductor device in the composite circuit is altered. This occurs in such a fashion that it, in turn, affects the electrical response of the composite circuit, i.e., the semiconductor device is trimmed so that, as a consequence, the composite circuit is trimmed.

Alternative embodiments of the inventive method include those embodiments for use when the precise effect of a particular pulse in altering a particular electrical characteristic of a circuit is not known in advance of its application. In such embodiments, a series of pulses is applied to the terminals contacted to the semiconductor device. After each pulse or packet of pulses is applied, the particular electrical characteristic is measured to determine whether the predetermined value of the electrical characteristic has been achieved. Further pulses are applied until the measurement indicates that the predetermined value has been achieved and that further alteration by applying further pulses is not required. Thus, such embodiments provide a method of achieving the desired result when, as will be true in general, the precise degree to which the alteration pulses is required is not known a priori. Nevertheless, it has been found in practice that semiconductor chips of the same type and provided by the same manufacturer, display substantially the same electrical characteristics. Thus, after one has empirically arrived at the required pulse characteristics, i.e., amplitude, duration and number, required to achieve a predetermined result for one of these chips, it may subsequently be repeated on other like integrated circuit chips with substantially the same results.

The inventive method may be used with discrete components and/or integrated circuits fabricated from a variety of semiconductor materials including, withoiut limitation: silicon, germanium, III–V compounds such as gallium arsenide, III–V ternary alloys, III–V quaternary alloys, II–VI compounds, or II–VI ternary alloys.

BRIEF DESCRIPTION OF THE DRAWING

A complete understanding of the present invention may be gained by considering the following detailed description in conjunction with the accompanying drawing, in which.

To facilitate understanding, identical reference numerals are used to designate elements common to the figures.

DETAILED DESCRIPTION

Figure 1:
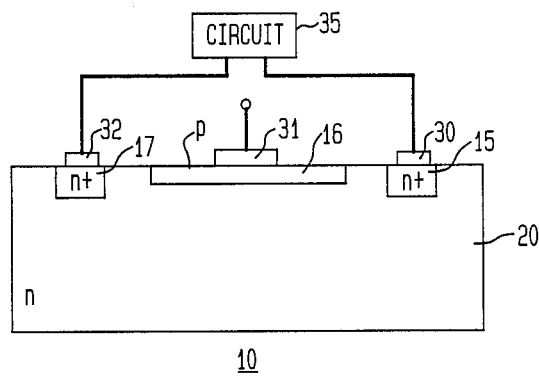
FIG. 1 shows, in pictorial form, a cross section of an N-channel JFET which is trimmed in accordance with the inventive method.

FIG. 1 shows, in pictorial form, a cross section of N-channel JFET 10, for example, a 2N5457 N-channel JFET, which is trimmed in accordance with the inventive method, JFET 10 includes n+ source region 15, p gate region 16, and n+ drain region 17; all embedded in n-type substrate 20. Electrodes 30–32 are contacted to, in order, source 15, gate 16 and drain 17, respectively. Electrodes 30–32 are typically formed from metal, for example, aluminum. Although electrodes 30–32 are shown in FIG. 1 to be formed from a single material, i.e., aluminum, it is within the spirit of the present invention for electrodes 30–32 to be formed from structures comprising several materials and layers of materials, some of which materials do not necessarily have to be metals.

In accordance with a preferred embodiment of the inventive method, a pulse generated in circuit 35 is applied to electrodes 30 and 32 of JFET 10, respectively. For example, we have applied a pulse having a voltage amplitude of 400 volts, energy of 8 millijoules and an RC time constant of 160 usec obtained from the discharge of a 0.1 uf capacitor to drive drain 17 positive and source 15 negative. In accordance with the present understanding of the preferred embodiment of the inventive method, the temperature of the semiconductor material between electrodes 30 and 32 rises in response to the application of the pulse thereto. Specifically, the temperature rises above the eutectic temperature of aluminum and silicon. When this occurs, silicon migrates into the aluminum of terminal 30 and/or 32 and aluminum dendrites or filaments are formed in the semiconductor material therebetween. This alters the electrical characteristics of JFET 10. Specifically, the introduction of aluminum dendrites into JFET 10 causes the transconductance of JFET 10 to decrease and $I_{DSS}$ to increase, $I_{DSS}$ being defined as the drain current when the gate-source voltage equals zero.

In principle, the pulses used in embodiments of the inventive method could take the form of, for example, constant current pulses, constant voltage pulses or constant energy pulses. These types of pulses are described because they present relatively straightforward applications for the inventive method. Nevertheless, it should be clear to those skilled in the art that other and more complex types of pulses may be used when practicing the inventive method. It should be clear to those skilled in the art that a constant energy pulse may be generated by discharging a capacitor through a resistor. In this case, the time constant of the pulse is determined to be the product of the resistance and the capacitance. For example, discharging a 0.1 uf capacitor through a 1.6K resistor gives a 160 usec time constant. Further, whenever such a capacitor is charged with a voltage of 350 volts, the energy of the resulting pulse will be $CV^2/2$, or 6.125 millijoules and when the capacitor is charged with a voltage of 400 volts, the energy of the resulting pulse will be 8 millijoules.

Figure 2:
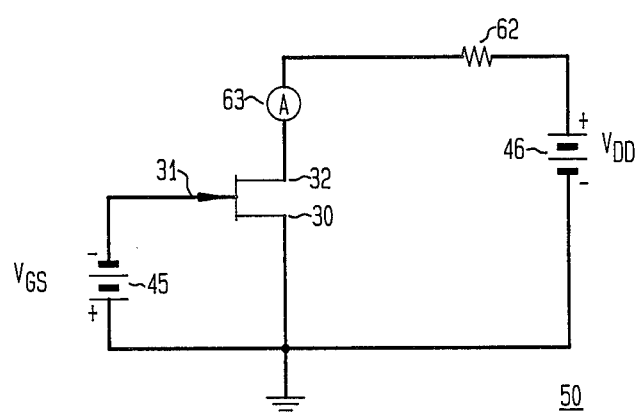
FIG. 2 shows a circuit used to measure the transconductance of an N-channel JFET trimmed in accordance with the inventive method.

FIG. 2 shows a circuit used to measure the transconductance of N-channel JFET 10 of FIG. 1. $V_{DD}$ power supply 46 drives current $I_D$ into drain terminal 32 through resistor 62. Meter 63 measures current $I_D$. $V_{GS}$ voltage supply 45 is connected between gate terminal 31 and source terminal 30, and source terminal 30 is connected to ground. We have used the circuit shown in FIG. 2 to measure the transconductance which is determined as the difference in $I_D$ induced by the corresponding difference in $V_{GS}$.

Before trimming in accordance with the inventive method we measured the following:

| $V_{GS}$ | $V_{DS}$ | $I_D$ | |
|---|---|---|---|
| 0 | 5 V | 4.13 mA | (this is $I_{DSS}$) |
| −200 mV | 5 V | 3.35 mA | |

As a result, the transconductance=3.90 m mhos.

After trimming with a single pulse having a voltage of 400 volts, a pulse energy of 8 millijoules and an RC time constant of 160 usec we measured the following:

| $V_{GS}$ | $V_{DS}$ | $I_D$ | |
|---|---|---|---|
| 0 | 5 V | 4.50 mA | (this is $I_{DSS}$) |
| −200 mV | 5 V | 3.75 mA | |

As a result, the transconductance=3.75 m mhos. Note that after the trim, the transconductance decreased and $I_{DSS}$ increased.

In a second example, as applied to a second JFET, before trimming in accordance with the inventive method we measured the following:

| $V_{GS}$ | $V_{DS}$ | $I_D$ | |
|---|---|---|---|
| 0 | 5 V | 1.33 mA | (this is $I_{DSS}$) |
| −200 mV | 5 V | 0.83 mA | |

As a result, the transconductance=2.50 m mhos.

After trimming with a single pulse having a voltage of 300 volts, a pulse energy of 4.5 millijoules and an RC time constant of 160 usec we measured the following:

| $V_{GS}$ | $V_{DS}$ | $I_D$ | |
|---|---|---|---|
| 0 | 5 V | 1.45 mA | (this is $I_{DSS}$) |
| −200 mV | 5 V | 1.00 mA | |

As a result, the transconductance=2.25 m mhos. Note that once again after the trim, the transconductance decreased and $I_{DSS}$ increased.

Figure 3:
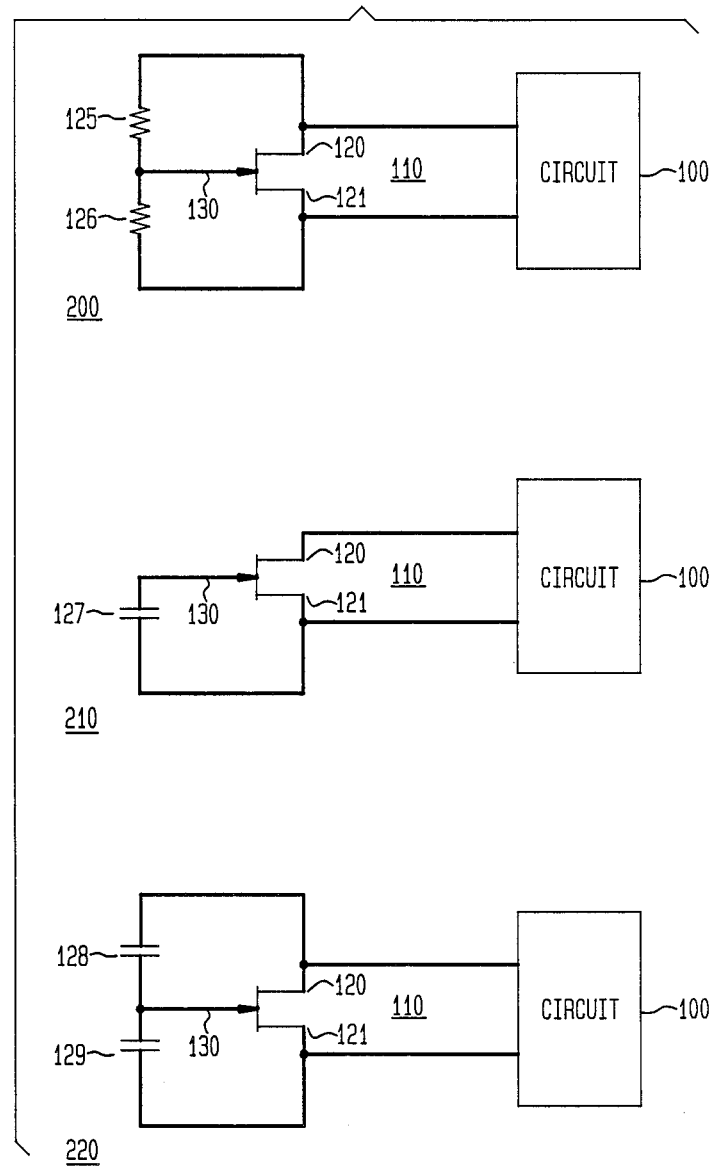
FIG. 3 shows, in pictorial form, examples of various circuit configurations for trimming MOSFETs in accordance with the inventive method.

Further embodiments of the inventive method are used to alter the electrical characteristics of MOSFETS. For example: (1) pulses may be applied between the drain and source when the gate and source are tied together to help prevent destruction of the gate; (2) pulses may be applied between the drain and source when the gate and drain are tied together to help prevent destruction of the gate; (3) pulses may be applied between the drain and source when the gate floats. FIG. 3 shows further embodiments of the inventive method where: (1) circuit configuration 200 shows MOSFET 110 being trimmed by applying pulses from circuit 100 across drain terminal 120 and source terminal 121 while gate 130 is returned to drain 120 and source 121 through resistors 125 and 126, respectively; (2) circuit configuration 210 shows MOSFET 110 being trimmed by applying pulses from circuit 100 across drain terminal 120 and source terminal 121 while gate 130 is returned to source 121 through capacitor 127; and (3) circuit configuration 220 shows MOSFET 110 being trimmed by applying pulses from circuit 100 across drain terminal 120 and source terminal 121 while gate 130 is returned to drain 120 and source 121 through capacitors 128 and 129, respectively.

Figure 4:
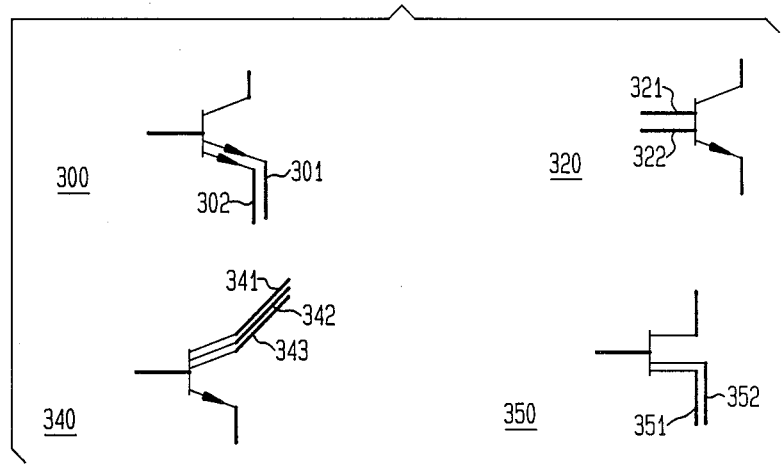
FIG. 4 shows, in pictorial form, examples of various multi-pin semiconductor devices which are trimmed in accordance with the inventive method.

Further embodiments of the inventive method are used to alter the electrical characteristics of multi-pin devices, and specifically to trim the electrical characteristics between like pins on such devices as multi-base, multi-collector or multi-emitter bipolar transistors, field-effect transistors and so forth. FIG. 4 shows, in pictorial form, various multi-pin semiconductor devices which are trimmed in accordance with the present invention. For example, (1) device 300 is a bipolar transistor having multiple emitters 301 and 302, device 300 being trimmed by applying pulses between emitters 301 and 302; (2) device 320 is a bipolar transistor having multiple bases 321 and 322, device 320 being trimmed by applying pulses between bases 321 and 322; (3) device 340 is a bipolar transistor having multiple collectors 341, 342 and 343, device 340 being trimmed by applying pulses between collectors 341 and 342, and/or collectors 341 and 343, and/or collectors 342 and 343; and (4) device 350 is a field-effect transistor having multiple sources 351 and 352, device 350 being trimmed by applying pulses between sources 351 and 352.

Figure 5:
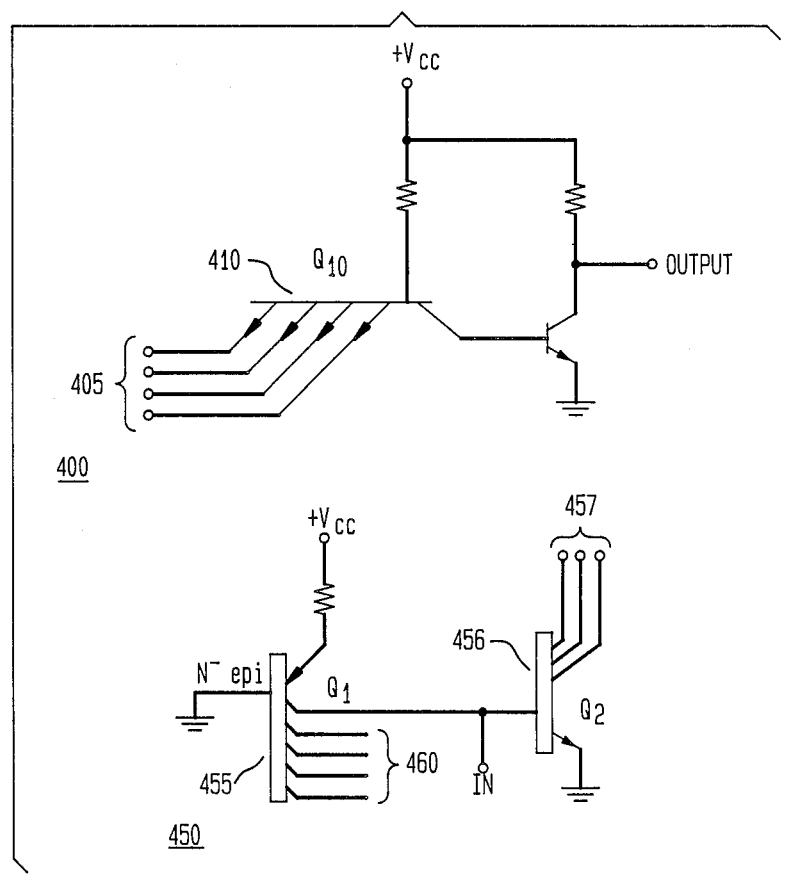
FIG. 5 shows, in pictorial form, examples of various multi-device circuits whose electrical characteristics are altered in accordance with the inventive method.

Further embodiments of the invention method are used to alter one or more electrical characteristics of a circuit by altering the electrical characteristics of a device contained therein. FIG. 5 shows, in pictorial form, several multi-device circuits whose electrical characteristics are altered in accordance with the inventive method. Circuit 400 shown in FIG. 5 is a TTL (Transistor-Transistor Logic) logic gate which includes multiple emitter NPN transistor 410. In accordance with the above-described embodiments of the inventive method, the performance of transistor 410 and, as a result, the performance of circuit 400, is altered by applying pulses to trim between emitters 405 of transistor 410.

Circuit 450 shown in FIG. 5 is an I²L (Integrated-Injection Logic) device which includes multiple collector PNP transistor 455 and multiple collector NPN transistor 456. In accordance with the above-described embodiments of the inventive method, the performance of transistor 455 and, as a result, the performance of circuit 450, is altered by applying pulses to trim between collectors 460 of transistor 455. Alternatively, in accordance with the above-described embodiments of the inventive method, the performance of transistor 456 and, as a result, the performance of circuit 450, is altered by applying pulses to trim between collectors 457 of transistor 456.

Figure 6:
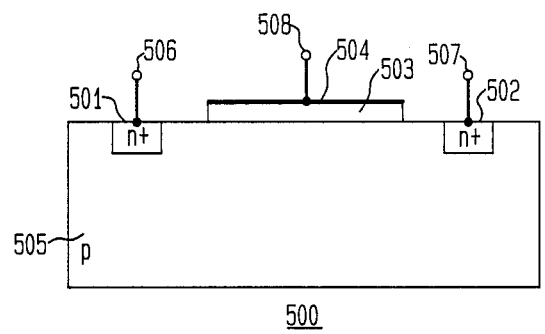
FIG. 6 shows, in pictorial form, a cross section of an N-channel, enhancement mode MOSFET which is trimmed in accordance with the inventive method.

FIG. 6 shows, in pictorial form, a cross section of an N-channel, enhancement-mode MOSFET which is trimmed in accordance with the inventive method. MOSFET 500 includes N+ source region 501, N+ drain region 502, P-type substrate 505 and gate dielectric 503. The gate 504 itself can be made of a metal, a polycrystalline silicon-metal sandwich or similar technologies well known to those of ordinary skill in the art. In accordance with a preferred embodiment of the inventive method, a pulse or pulses applied between electrode 506 and electrode 507 can be used to alter the performance of transistor 500 and, hence, trim the performance of a circuit of which it is a part.

Figure 7:
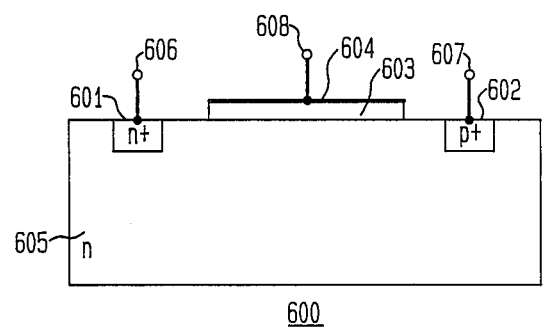
FIG. 7 shows, in pictorial form, a cross section of a P-channel, enhancement mode MOSFET which is trimmed in accordance with the inventive method.

FIG. 7 shows, in pictorial form, a cross section of a P-channel, enhancement-mode MOSFET which is trimmed in accordance with the inventive method. MOSFET 600 includes P+ source region 601, P+ drain region 602, N-type substrate 605 and gate dielectric 603. The gate 604 itself can be made of a metal, a polycrystalline silicon-metal sandwich or similar technologies well known to those of ordinary skill in the art. In accordance with a preferred embodiment of the inventive method, a pulse or pulses applied between electrode 606 and electrode 607 can be used to alter the performance of transistor 600 and, hence, trim the performance of a circuit of which it is a part.

Clearly, those skilled in the art recognize that further embodiments of the present invention may be made without departing from its teachings. For example, it is within the spirit of the present invention that pulses having other and different voltages, time durations and energy levels may be used in practicing the inventive method. A necessary and sufficient condition of embodiments of the inventive method is that the amplitude of one or more of the electrical parameters and the time duration of such pulses be such as to achieve the requisite alteration without destroying the device.

What is claimed is:

1. A method for altering an electrical characteristic of a circuit having at least one active semiconductor device and at least one electrode contacted to the active semiconductor device, the method comprising the step of applying at least one electrical pulse to the active semiconductor device, including applying the pulse to at least one of the at least one electrode, the pulse having sufficient amplitude of one or more of its electrical parameters and time duration to alter the electrical characteristics of the device, and, thereby, to alter the electrical characteristic of the circuit, the amplitudes of the electrical parameters and the time duration of the at least one pulse being sufficient to form dendrites or filaments of material from the at least one electrode in the active semiconductor device wherein the dendrites or filaments are not of a geometry to cause a short to be formed between any pair of electrodes of the active semiconductor device and wherein, after the steps of applying the method have been completed, no short has been formed thereby between any pair of electrodes of the circuit.

2. The method of claim 1 wherein the active semiconductor device is comprises of a first and second semiconductor selected from the group consisting of: silicon, germanium, III–V compunds, and II–VI compounds.

3. The method of claim 1 wherein the electrodes are comprises of at least one metal.

4. The method of claim 1 wherein the circuit comprises a field-effect transistor (FET) and the at least one pulse is applied between the source and drain.

5. The method of claim 1 wherein the at least one pulse has an amplitude of one or more of its electrical parameters which substantially exceeds the amplitude of the normal operating condition of the corresponding electrical parameters for the device.

6. The method of claim 1 wherein the circuit comprises a metal-oxide-semiconductor field-effect transistor (MOSFET) and the at least one pulse is applied between the source and drain and the gate is connected to the source and drain through a first and a second resistor, respectively.

7. The method of claim 1 wherein the device comprises a device having a multiple of like pins and the step of applying the at least one pulse comprises applying the at least one pulse to at least two of the like pins.

8. The method of claim 7 wherein the multi-pin device comprises a multi-pin bipolar transistor.

9. The method of claim 1 wherein the circuit comprises a MOSFET and the at least one pulse is applied between the source and drain and the gate is connected to at least one of the group consisting of the source and the drain through at least one capacitor.

10. The method of claim 5 wherein the at least one pulse is a voltage pulse.

11. The method of claim 5 wherein the at least one pulse is a current pulse.

12. The method of claim 5 wherein the at least one pulse is a substantially constant energy pulse.

13. A method for altering an electrical characteristic of a circuit having at least one active semiconductor device and at least one electrode contacted to the active semiconductor device, the method comprising the steps of: (1) measuring the value of the electrical characteristic of the circuit; (2) comparing the measured value with a predetermined value and terminating the method if the difference between the measured value and the predetermined value is smaller than a predetermined amount; (3) applying at least one electrical pulse to the active semiconductor device, including applying the pulse to at least one of the at least one electrode, the pulse having sufficient amplitude of one or more of its electrical parameters and time duration to alter the electrical characteristics of the active semiconductor device, and, thereby to alter the electrical characteristic of the circuit, the amplitudes of the electrical parameters and the time duration of the at least one pulse being sufficient to form dendrites or filaments of material from at least one electrode in the active semiconductor device wherein the dendrites or filaments are not of a geometry to cause a short to be formed between any pair of electrodes of the active semiconductor device; (4) returning to step (1); and wherein, after the steps of the method have been completed, no short has been formed thereby between any pair of electrodes of the circuit.

14. A method for altering an electrical characteristic of a circuit having at least one active semiconductor device and at least one electrode contacted to the active semiconductor device, the method comprising the steps of: (1) applying at least one electric pulse to the active semiconductor device, including applying the pulse to at least one of the at least one electrode, the pulse having sufficient amplitude of one or more of its electrical parameters and time duration to alter the electrical characteristics of the active semiconductor device, and, thereby to alter the electrical characteristic of the circuit, the amplitudes of the electrical parameters and the time duration of the at least one pulse being sufficient to form dendrites or filaments of material from at least one electrode in the active semiconductor device wherein the dendrites or filaments are not of a geometry to cause a short circuit to be formed between any pair of electrodes of the active semiconductor device; (2) measuring the value of the electrical characteristic of the circuit; (3) comparing the measured value with a predetermined value; (4) repeating steps 1-3 until the difference between the measured value and the predetermined value is smaller than a predetermined amount; and wherein, after the steps of the method have been completed, no short has been formed thereby between any pair of electrodes of the circuit.

15. A method for matching an electrical characteristic of a first circuit with that of another like circuit, each circuit having aat least one active semiconductor device and at least one electrode contacted to the active semiconductor device, the method comprising the steps of: (1) measuring the electrical characteristic of both circuits; (2) applying at least one electrical pulse to the active semiconductor device of the first circuit, including applying the pulse to at least one of the at least one electrode of the first circuit, the pulse having sufficient amplitude of one or more of its electrical parameters and time duration to alter the electrical characteristics of the active semiconductor device, and, thereby to alter the electrical characteristic of the first circuit, the amplitudes of the electrical parameters and the time duration of the at least one pulse being sufficient to form dendrites or filaments of material from at least one electrode in the active semiconductor device of the first circuit wherein the dendrites or filaments are not of a geometry to cause a short circuit to be formed between any pair of electrodes of the active semiconductor device of the first circuit; (3) measuring the electrical characteristic of the first circuit; (4) comparing the measured value of the electrical characteristic of the first circuit with the measured value of the electrical characteristic of the another like circuit; (5) repeating steps 2-4 until the difference between the electrical characteristic of both circuits is smaller than a predetermined amount; and wherein, after the steps of the method have been completed, no short has been formed thereby between any pair of electrodes of the first circuit.

16. A method for matching an electrical characteristic of a first circuit with that of another like circuit, each circuit having at least one active semiconductor device and at least one electrode contacted to the active semiconductor device, the method comprising the steps of: (1) applying at least one electric pulse to the active semiconductor device of the first circuit, including applying the pulse to at least one of the at least one electrode of the first circuit, the pulse having sufficient amplitude of one or more of its electrical parameters and time duration to alter the electrical characteristics of the active semiconductor device, and, thereby to alter the electrical characteristic of the first circuit, the amplitudes of the electrical parameters and the time duration of the at least one pulse being sufficient to form dendrites or filaments of material from at least one electrode in the active semiconductor device of the first circuit wherein the dendrites or filaments are not of a geometry to cause a short circuit to be formed between any pair of electrodes of the active semiconductor device of the first circuit; (2) measuring the electrical characteristic of both circuits; (3) comparing the measured values of the electrical characterisitic; (4) repeating steps 1-3, where step 2 hereafter only requires measurement of the electrical characterisitic of the circuit which is being altered, until the difference between the electrical characteristic of both circuits is smaller than a predetermined amount; and wherein, after the steps of the method have been completed, no short has been formed thereby between any pair of electrodes of the first circuit.

* * * * *